(12) United States Patent
Lee et al.

(10) Patent No.: US 11,715,669 B2
(45) Date of Patent: Aug. 1, 2023

(54) THROUGH SILICON VIA AND METHOD OF MANUFACTURING THE SAME

(71) Applicant: Powerchip Semiconductor Manufacturing Corporation, Hsinchu (TW)

(72) Inventors: Shih-Ping Lee, Hsinchu (TW); Tse-Hsien Wu, Miaoli County (TW); Pin-Chieh Huang, Hsinchu County (TW); Yu-Hsiang Chien, Taoyuan (TW); Yeh-Yu Chiang, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 246 days.

(21) Appl. No.: 17/394,372

(22) Filed: Aug. 4, 2021

(65) Prior Publication Data

US 2022/0130725 A1 Apr. 28, 2022

(30) Foreign Application Priority Data

Oct. 26, 2020 (TW) ................. 109137019

(51) Int. Cl.
*H01L 23/48* (2006.01)
*H01L 21/768* (2006.01)

(52) U.S. Cl.
CPC .. *H01L 21/76898* (2013.01); *H01L 21/76832* (2013.01); *H01L 21/76877* (2013.01); *H01L 23/481* (2013.01)

(58) Field of Classification Search
CPC ....... H01L 23/00; H01L 23/48; H01L 23/481; H01L 23/522; H01L 23/538; H01L 23/5226; H01L 23/5386; H01L 21/768; H01L 21/76832; H01L 21/76877; H01L 21/76898; H01L 21/76807; H01L 21/76816; H01L 21/76846; H01L 21/76871
USPC ......................................................... 438/667
See application file for complete search history.

(56) References Cited

U.S. PATENT DOCUMENTS

| | | | |
|---|---|---|---|
| 7,969,013 B2 | 6/2011 | Chen | |
| 9,646,930 B2 | 5/2017 | Tezcan | |
| 2013/0141833 A1* | 6/2013 | Moslehi | H01L 21/02164 438/455 |
| 2013/0260556 A1 | 10/2013 | Farooq | |
| 2013/0341620 A1* | 12/2013 | Birner | H01L 22/26 257/E23.179 |
| 2014/0203394 A1 | 7/2014 | Lin | |
| 2018/0047807 A1* | 2/2018 | Ho | H01L 21/02271 |
| 2020/0144158 A1 | 5/2020 | Seo | |

* cited by examiner

*Primary Examiner* — Chuong A Luu
(74) *Attorney, Agent, or Firm* — Winston Hsu

(57) ABSTRACT

A method of manufacturing a through silicon via (TSV) is provided in the present invention, including steps of forming a TSV sacrificial structure in a substrate, wherein the TSV sacrificial structure contacts a metal interconnect on the front side of the substrate, performing a backside thinning process to expose the TSV sacrificial structure from the back side of the substrate, removing the TSV sacrificial structure to form a through silicon hole, and filling the through silicon hole with conductive material to form a TSV.

9 Claims, 14 Drawing Sheets

THROUGH SILICON VIA AND METHOD OF MANUFACTURING THE SAME

BACKGROUND OF THE INVENTION

1. Field of the Invention

The present invention relates generally to a method of manufacturing through silicon via (TSV), and more specifically, to a novel method of manufacturing through silicon via with advantages of via first, via middle and via last processes and through silicon via (TSV) thereof.

2. Description of the Prior Art

Through-silicon via (TSV) is a vertical interconnect that passes through silicon wafers or dies. Unlike common vias that connect metal layers on a substrate, TSV passes through the whole substrate or die to achieve chip-to-chip, chip-to-wafer and/or wafer-to-wafer circuit interconnections. The fundamental limit of Moore's Law may last for many years by adopting TSVs in 3D interconnect technology to replace conventional wire bonding approach, so that a plurality of ICs may be interconnected and packaged together in a 3D stack to integrate the logic, memory and analog devices formed therein with an operating architecture similar to System-on-Chip (SoC). Since the connecting lines for this interconnection approach are set between chips, it may have shorter inner connecting paths that help to increase data transmission speed, reduce the amount of noise and improve overall performance of the device without compromising the high density requirement, as well as overcoming the obstacles that the SoC technology currently faces in the aspects of process and package.

Depending on the process, the method of manufacturing TSV may be classified into via first, via middle and via last. These three approaches have their own advantages and disadvantages. The feature of via first process is that its TSVs are formed before MOS devices. Since it is required to withstand high temperature in FEOL process, the material of TSV in this approach is preferably doped polycrystalline silicon, which has inherently higher resistance and is subject to potential impurity diffusion and contamination problem in high temperature. The TSVs in via middle process are formed after MOS devices and before metal interconnects, with advantages of small and compact TSVs to achieve wide I/O standard in multi-interconnect architecture, and since the TSVs in this approach are manufactured in fabrication foundry, it avoids the TVS aligning problem that usually occurs in outsourced test foundry. The disadvantage of via middle process is that it requires additional, complex copper revealing process to reveal copper based TSVs, which leads to increased cost of manufacture. Furthermore, the mismatched coefficients of thermal expansion between copper based TSVs and surrounding silicon in this approach may easily cause defects and damages during the thermal cycling in follow-up processes, which may further result in reliability problem. Regarding the via last process, although this process is relatively simple, it require large TSV size given the fact that the manufacturing of TSVs in this approach is usually in outsourced test foundry and the alignment of TSVs thereof is a critical factor. It is difficult to manufacture metal interconnects with multiple connections and fine pitches in this approach. Furthermore, the step of forming TSV hole using dry etching in via last process may cause the already formed components damaged and deteriorated by plasma due to antenna effect.

Accordingly, those of skilled in the art still need to develop and improve current TSV processes in order to solve the aforementioned problems that usually occur in conventional skills.

SUMMARY OF THE INVENTION

In the light of the aforementioned problems that usually occur in conventional processes, the present invention hereby provides a novel method for manufacturing through silicon via (TSV). With the features of defining the positions of TSVs in advance by forming TSV sacrificial structures in FEOL process as well as using simple and harmless wet etching process in BEOL backside thinning process to remove the TSV sacrificial structures, the resulting TSV may be precisely aligned without damaging the components during the process. The approach of present invention is provided with the merits of via first, via middle and via last processes without the disadvantages of conventional skills that usually occur in these processes.

One aspect of present invention is to provide a method of manufacturing TSV, including steps of providing a substrate with a front side and a back side, forming a TSV sacrificial structure in the substrate, wherein the TSV sacrificial structure is exposed from the front side, forming a metal interconnect on the front side and the TSV sacrificial structure, wherein the metal interconnect contacts with the TSV sacrificial structure, performing a backside thinning process to expose the TSV sacrificial structure from the back side, removing the TSV sacrificial structure to form a TSV hole, and filling up the TSV hole with conductive material to form a TSV.

Another aspect of present invention is to provide a through silicon via (TSV), including a substrate with a front side and a back side, a dielectric layer on the front side of the substrate, wherein the dielectric layer is provided with metal interconnects formed therein, a TSV hole through the substrate, a protection layer on a sidewall of the TSV hole and on the back side of the substrate, a conductive layer filling up the TSV hole, and a barrier layer between the conductive layer and the protection layer and between the conductive layer and the dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
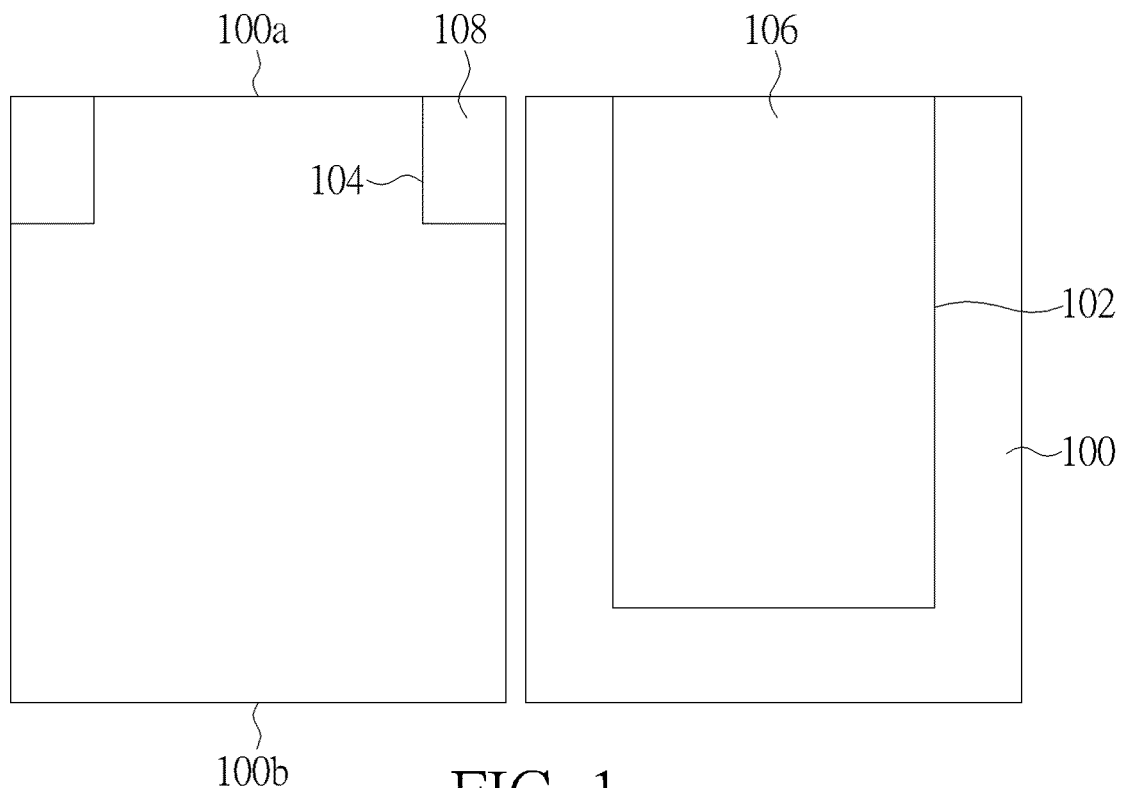
FIGS. 1-9 are schematic cross-sectional views of a process for manufacturing through silicon via (via) in accordance with the preferred embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

The process flow of manufacturing the through silicon via (TSV) in a preferred embodiment of present invention will be described hereinafter according to the cross-sectional structures shown in FIG. 1 to FIG. 9. Please note that these figures are all divided into a left part and a right part, which illustrates respectively the structures in a normal transistor region and a TSV region of a substrate to show same and different features in the TSV process and the normal transistor process of the present invention. In addition, since the present invention involves wafer backside process, the upper surface of the substrate is considered as the front side and the lower surface of the substrate is considered as the back side in the figures unless otherwise stated.

Firstly, please refer to FIG. 1. The semiconductor process of present invention begins from a substrate. A semiconductor substrate 100 such as a p-type doped monocrystalline substrate is first provided with different regions divided thereon, such as the transistor region in the left part of the figure and the TSV region in the right part of the figure. The substrate 100 is provided with opposite front side 100a and back side 100b. Conventional semiconductor components and metal interconnects will be formed on the front side 100a. In the embodiment of present invention, a TSV sacrificial structure 106 and shallow trench isolations 108 (or deep trench isolations with a depth less than the depth of the TSV sacrificial structure 106, and the figures of present invention will show only the shallow trench isolations 108 as a representative) are formed in the substrate 100. The two structures 106, 108 are both exposed from the front side 100a of the substrate. The shallow trench isolation 108 is used to isolate active areas for the components, while the TSV sacrificial structure 106 is formed temporarily in the deep trench 102 to reserve the space for the TSV and it will be removed in later process.

In the embodiment of present invention, steps of forming the TSV sacrificial structure 106 and shallow trench isolations 108 include: performing an anisotropic dry etching process such as an inductively coupled plasma etching process on the front side 100a of the substrate to form shallow trenches 104 and a deep trench 102 respectively in the substrate 100, wherein the deep trench 102 will become a TSV hole in later process with a depth greater than the depth of shallow trench 104, close to the back side 100b of the substrate 100. After the shallow trenches 104 and the deep trench 102 are formed, a PECVD process is performed to fill dielectric material such as silicon oxide in the shallow trenches 104 and deep trench 102, and a CMP process is then performed to remove the dielectric material above the front side 100a of the substrate, thereby forming the shallow trench isolations 108 and the TSV sacrificial structure 106.

Figure 2:
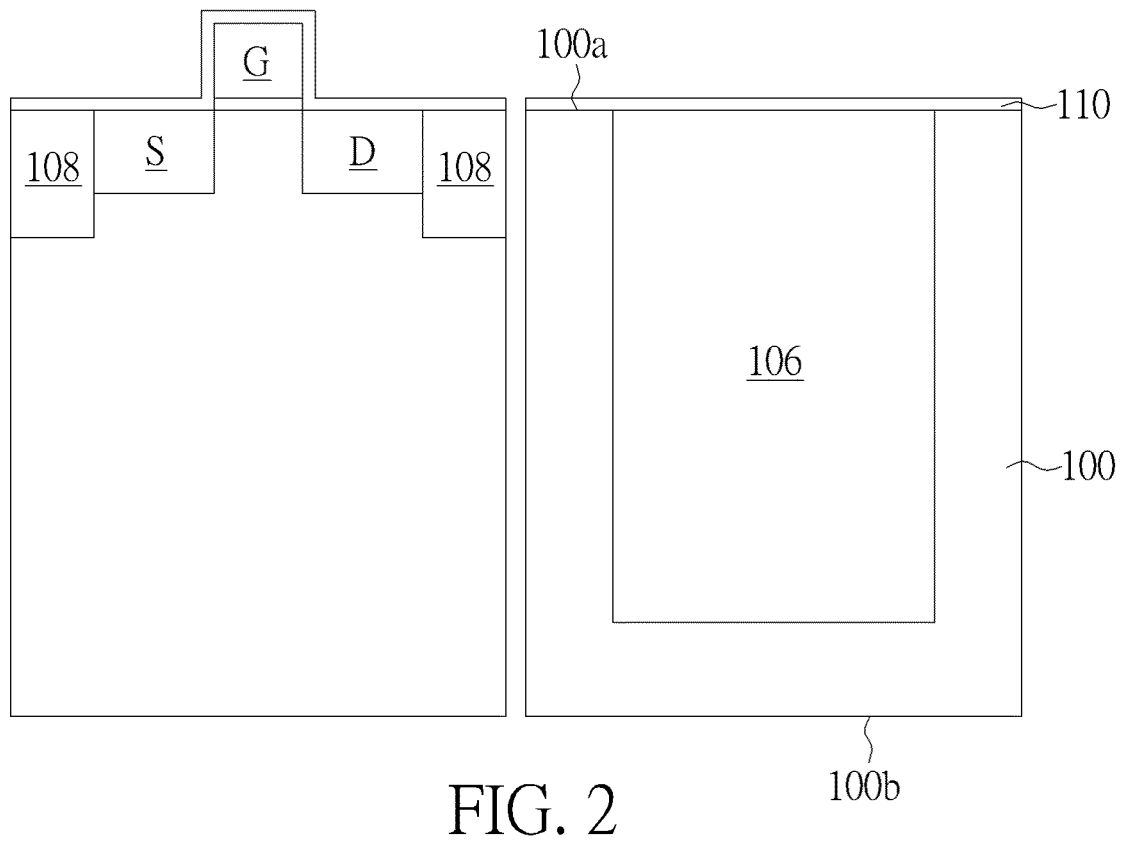

Please refer to FIG. 2. After the shallow trench isolations 108 and the TSV sacrificial structure 106 are formed, an ion implantation process is then performed to form source S, drain D and various unlabeled doped wells in the active areas divided by the shallow trench isolations 108, and a gate G (or buried gate) and an etch stop layer 110 are formed on the front side 100a of the substrate, wherein the etch stop layer 110 covers the surface of substrate 100 and gate G. In addition, a metal silicide process may be involved before the etch stop layer 110 is formed in order to form metal silicide (not shown) on the source S, drain D and gate G. This stage is front-end-of-line (FEOL) in semiconductor process flow. The materials of etch stop layer 110 and gate G may be silicon nitride and doped polycrystalline silicon, which may be formed by PECVD and photolithography process. Generally, the function of etch stop layer 110 is to act as a stop layer in follow-up contact hole etching and to apply stress on the substrate in order to improve carrier mobility. In the embodiment of present invention, the etch stop layer 110 is also formed on and contacts the TSV sacrificial structure 106 in order to provide etch stop effect in follow-up process for removing the TSV sacrificial structure 106.

Figure 3:
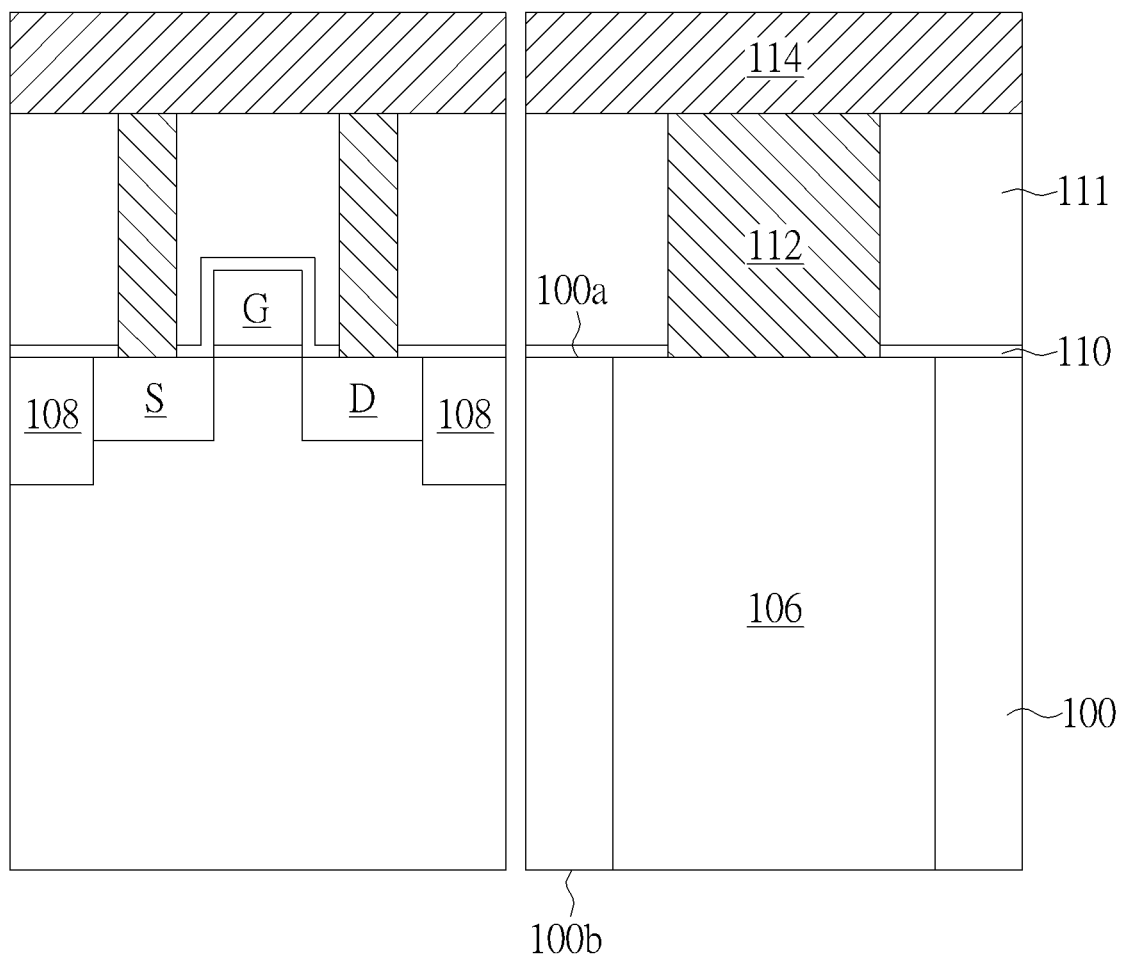

Please refer to FIG. 3. After the etch stop layer 110 is formed, an interlayer dielectric layer 111 is then formed on the front side 100a of the substrate. The interlayer dielectric layer 111 may be formed by CVD process with a material preferably but not limited of tetraethylorthosilicate (TEOS) or phosphosilicate glass (PSG). The interlayer dielectric layer 111 may also be formed by borophosphosilicate glass (BPSG) or low-k material. Thereafter, metal interconnects like contacts 112 and a first metal layer 114 are formed respectively in the interlayer dielectric layer 111 and on the interlayer dielectric layer 111. The contacts 112 and first metal layer 114 may be formed by dual damascene process. With regard to material, the material of contacts 112 may be conductive material like titanium (Ti), titanium nitride (TiN), tantalum (Ta), tantalum nitride (TaN), aluminum (Al) or tungsten (W), and the material of first metal layer 114 may be conductive material like titanium (Ti), titanium nitride (TiN), tantalum (Ta), tantalum nitride (TaN), aluminum (Al), copper (Cu) or tungsten (W). In the embodiment of present invention, contacts 112 would pass through the etch stop layer 110 and contact with the TSV sacrificial structure 106, source S and drain D below. Please note that in this embodiment, other metal interconnects and metal bumps may be further formed on the first metal layer 114, and other components like capacitors may be further connected on the first metal layer 114 and contacts 112. This embodiment shows only the contacts 112 and the first metal layer 114 as a representative for the structures on the front side 100a of the substrate. Refer still to FIG. 3. After metal interconnects like the contacts 112 and the first metal layer 114 are formed, a backside thinning process is then performed to remove a part of the substrate 100 from the back side 100b so that inner TSV sacrificial structure 106 may be exposed from the back side 100b of the substrate. The backside thinning process may include: bonding a carrier on the front side of the substrate, grinding the back side to reduce the thickness of the substrate, and polishing or wet etching the back side to expose the TSV sacrificial structure 106.

It can be known from the embodiment above that the TSV sacrificial structure 106 provided by the present invention has many advantages in comparison to prior art. Firstly, in comparison to conventional via first process, instead of forming doped polycrystalline silicon based TSV in high-temperature FEOL stage (i.e. the steps of forming sources S/drains D), the TSV may be replaced in advance with the silicon oxide based TSV sacrificial structure 106 in order to prevent impurity contamination in high temperature environment. Furthermore, in comparison to conventional via middle process, substitutional silicon oxide based TSV sacrificial structure 106 may effectively solve the reliability problem caused by the mismatched coefficient of thermal expansion between metal based TSVs and surrounding silicon during the thermal cycling after MEOL process (i.e. steps of forming interlayer dielectric layer 111 and contacts 112). In addition, since the material of TSV sacrificial structure 106 is silicon oxide, it is unnecessary to take into account the problem of metal contamination during the backside Cu revealing process, thus common grinding and polishing are enough to complete this step instead of costly backside Cu revealing process.

Figure 4:
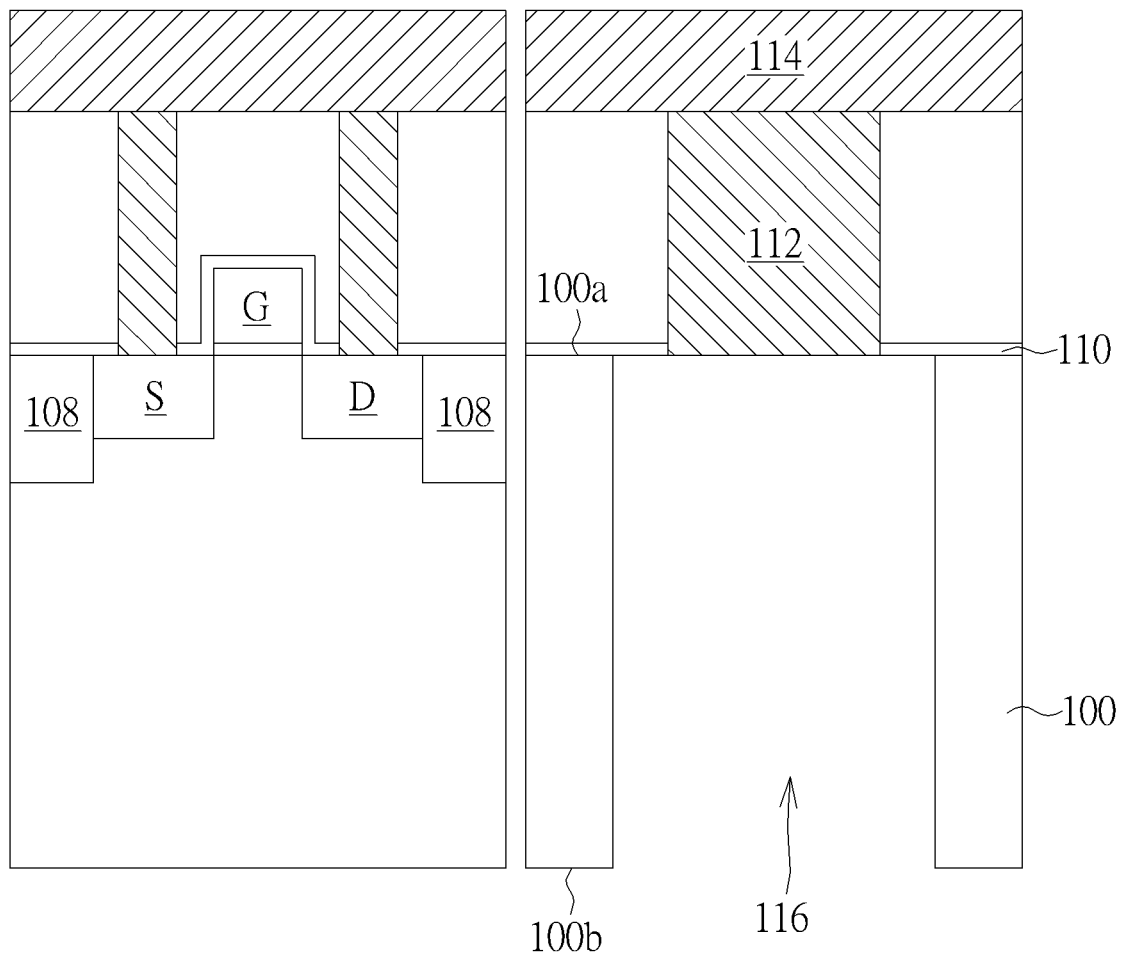

Next, please refer to FIG. 4. After the TSV sacrificial structure 106 is exposed, a wet etching process is then performed to remove the TSV sacrificial structure 106 and form a TSV hole 116 passing through the entire substrate 100. In this embodiment, etchant like diluted hydrofluoric acid with high etch selectivity to the silicon oxide based TSV sacrificial structure 106 may be used to easily and completely remove the TSV sacrificial structure 106 in the TSV hole 116 without damaging adjacent substrate 100, etch stop layer 110 and contact 112. Furthermore, in comparison to conventional via last process, problems like aligning the TSV hole with the contact 112 on the front side of the substrate and plasma damage of the components formed on the front side usually occur since plasma etching is used in the via last process to etch the TSV hole 116 from the back side 110b of the substrate. The present invention may avoid these problems by forming the contacts 112 and TSV sacrificial structure 106 in advance in the FEOL stage as well as by using the wet etching process with high selectivity and less harmfulness to form the TSV hole.

Figure 5:
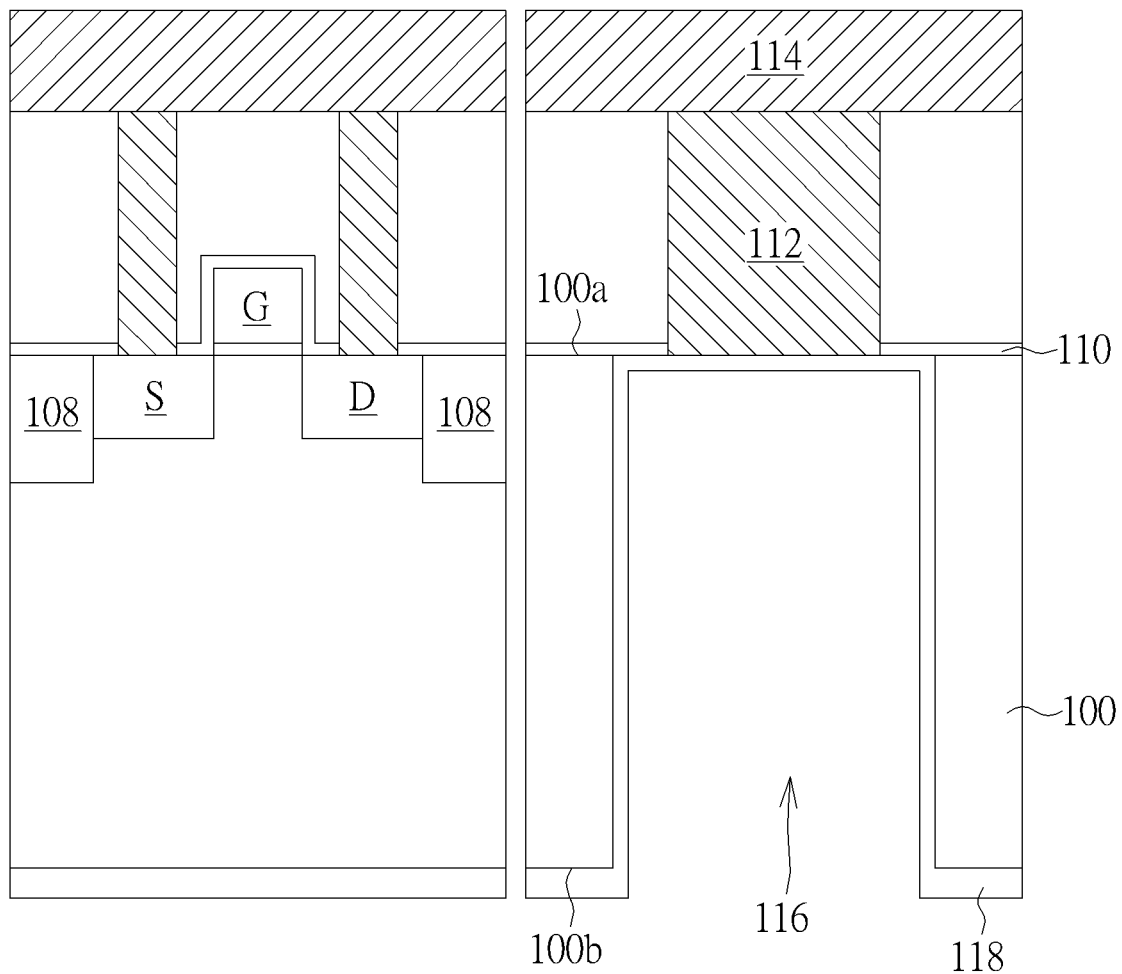

Please refer to FIG. 5. After the TSV hole is exposed 116, an insulating liner 118 is then formed on the surface of TSV hole 116, with material preferably like silicon oxide using PECVD process. In the embodiment of present invention, the insulating liner 118 may also be formed on the back side 100b of the substrate, wherein the thickness of this liner portion is preferably greater than the ones of other liner portions. The insulating liner 118 will become the insulating layer for the TSV in follow-up process.

Figure 6:
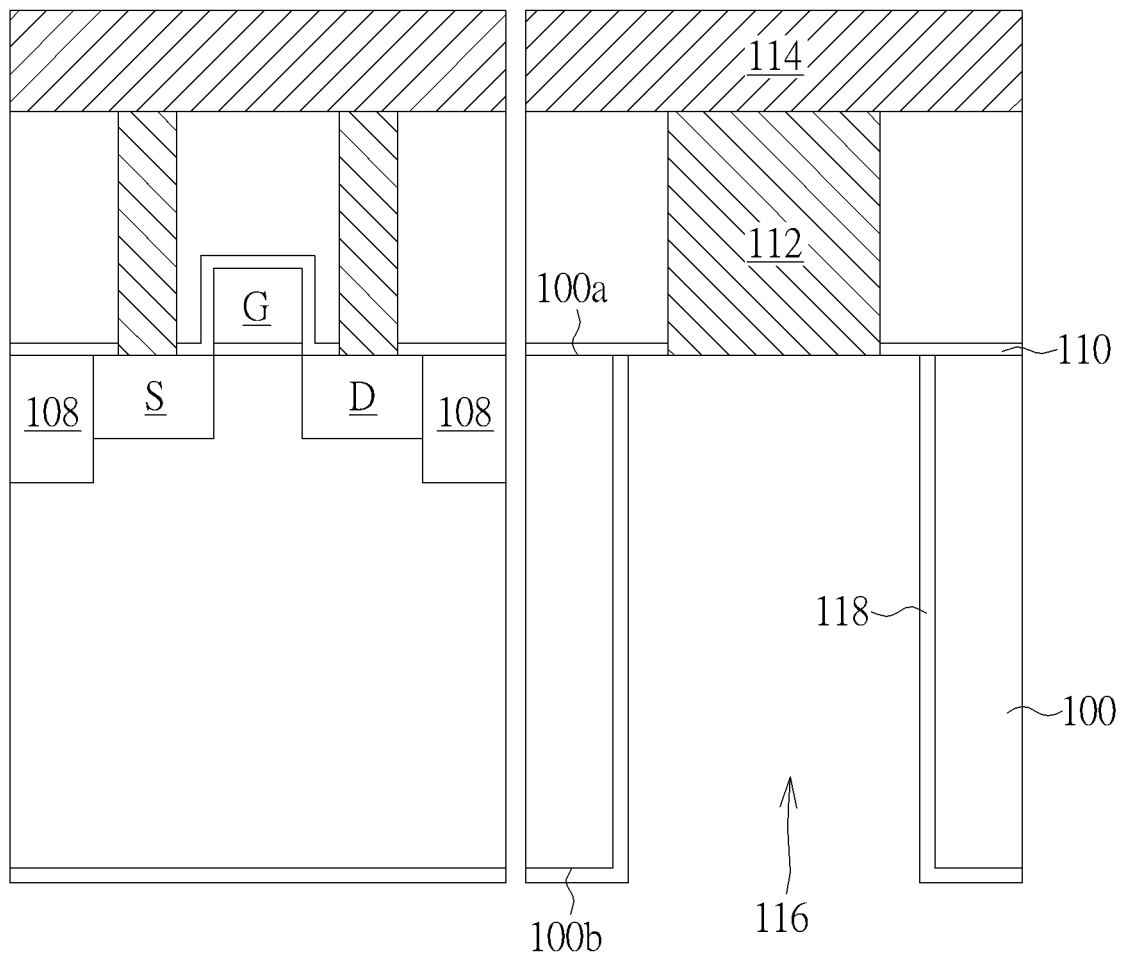

Please refer to FIG. 6. After the insulating liner 118 is formed, an anisotropic etch back process is performed to remove the insulating liner 118 on the back side of the TSV hole 116 in order to expose the contact 112. In this embodiment of present invention, the liner portion is not removed completely in the etch back process since the liner portion 118 on the back side 100b of the substrate has greater thickness. This portion will be kept in the process and function collectively with the insulating liner 118 on the sidewall of the TSV hole 116 as an insulating layer for the TSV.

Figure 7:
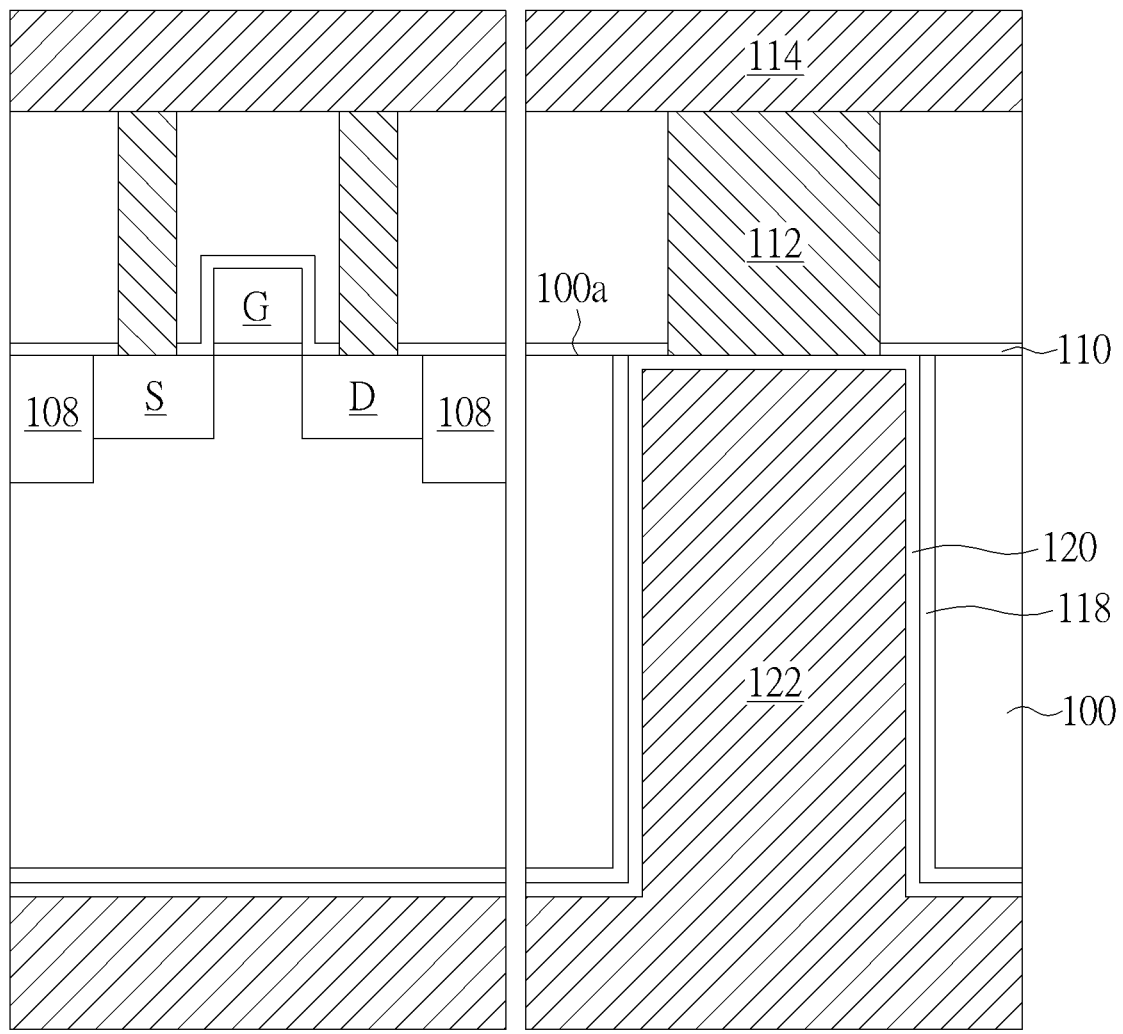

Please refer to FIG. 7. A barrier layer 120 and a conductive material layer 122 are formed sequentially in the TSV hole 116 and on the back side 100b of the substrate, wherein the barrier layer 120 would contact with the contacts 112 and etch stop layer 110 on the front side. The material of barrier layer 120 and conductive material layer 122 may be Ta/TaN/Ti/TiN and Cu respectively. A Cu seed layer (not shown) may be formed before forming the conductive material layer 122 in order to promote the growth of conductive material layer 122. The barrier layer 120 and the Cu seed layer may both be formed through PVD process, while the conductive material layer 122 may be formed through ECP (electrochemical Plating) process.

Figure 8:
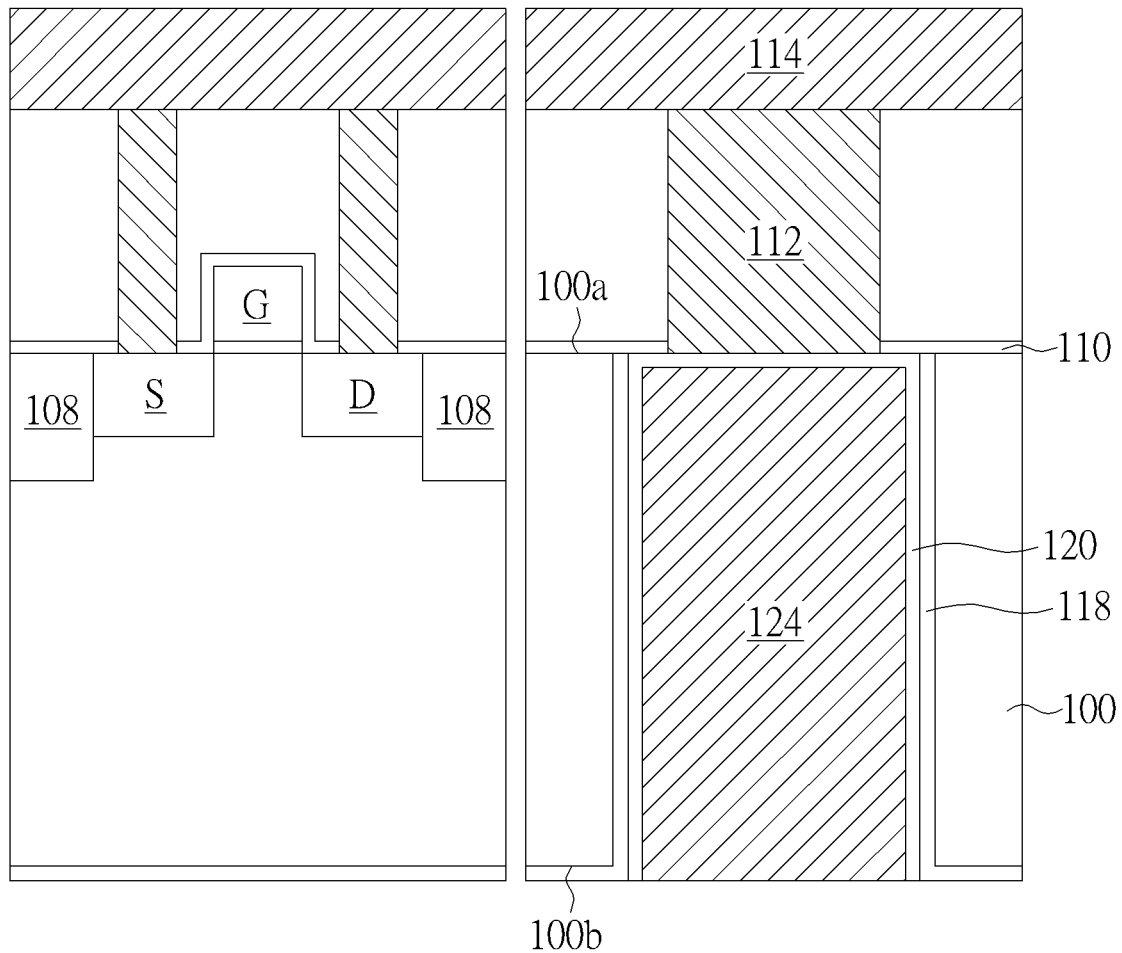

Please refer to FIG. 8. After the conductive material layer 122 is formed, a CMP process is then performed to remove unnecessary barrier layer 120 and conductive material layer 122 on the back side 100b of the substrate and only the part left in the TSV hole, thereby forming the TSV 124. Please note that in this embodiment, the insulating liner 118 on the back side 100b of the substrate functions as a stop layer, thus the insulating liner 118 will remain surrounding the TSV 124 as an insulating layer after the CMP process in order to avoid metal based TSV 124 contaminating the surrounding substrate.

Figure 9:
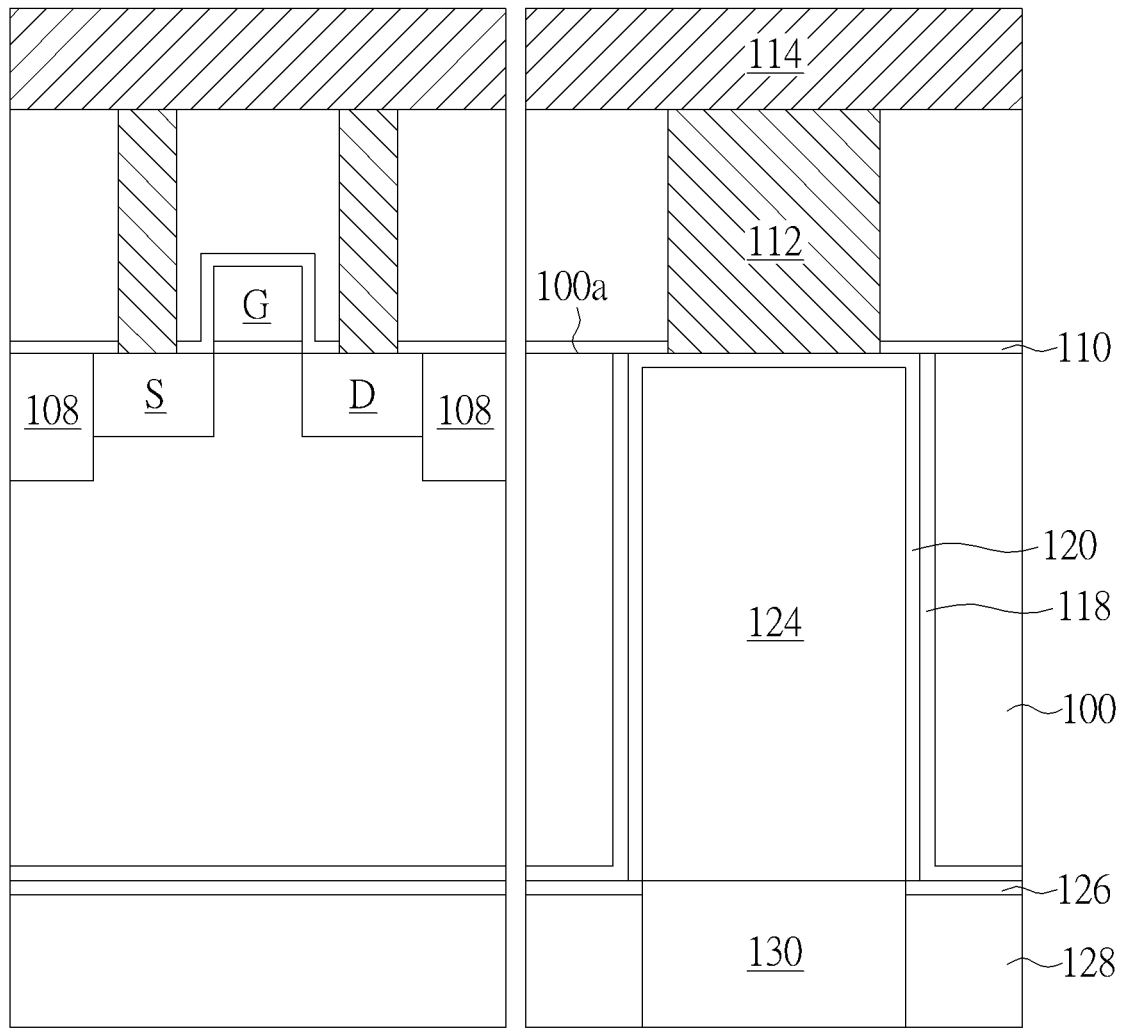

Please refer to FIG. 9. After the TSV 124 is formed, a silicon nitride layer 126 and a silicon oxide layer 128 are formed sequentially on the back side 100b of the substrate to act as a passivation layer on the back side, and a conductive bump 130 is formed in the silicon nitride layer 126 and the silicon oxide layer 128. The silicon nitride layer 126 and the silicon oxide layer 128 may be formed by CVD process. The bump 130 in the present invention may be various conductive bumps such as solder bump or stud bump, with the material of gold (Au), tin (Sn) or copper (Cu) formed by various available convention skills like evaporation, sputtering, electroplating, electrodeless plating, bumpless or printing method, but not limited thereto.

Next, the process flow of manufacturing the through silicon via (TSV) in another embodiment of present invention will be described hereinafter according to the cross-sectional structures shown in FIG. 10 to FIG. 13.

Figure 10:
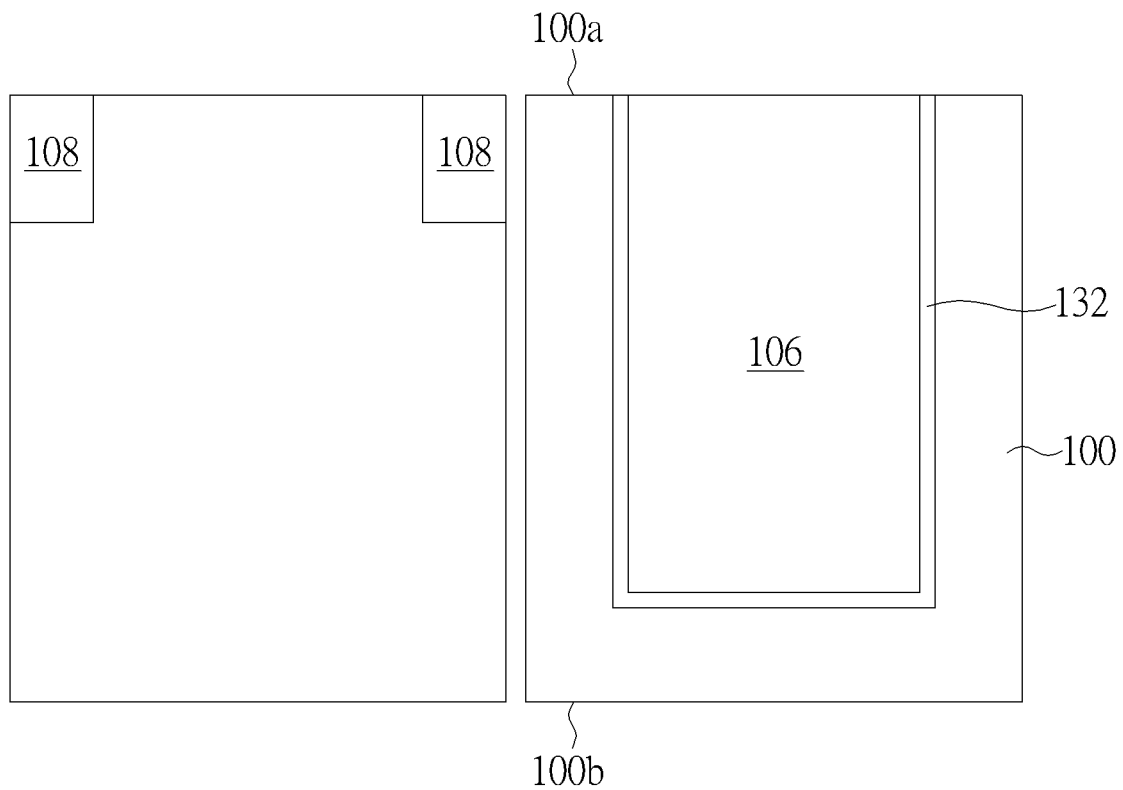
FIGS. 10-13 are schematic cross-sectional views of a process for manufacturing through silicon via (via) in accordance with another embodiment of the present invention.

Firstly, please refer to FIG. 10. The difference between this embodiment and the aforementioned embodiment lies in a protection 132 being formed in the deep trench before the TSV sacrificial structure 106 is formed in this embodiment. The chosen material for the protection layer 132 has considerable etch selectivity to the material of TSV sacrificial structure 106. For example, in the case that the material of TSV sacrificial structure 106 is silicon oxide, the material of protection layer 132 may be chosen from silicon nitride or silicon oxynitride. In this way, the protection layer 132 will not be removed in follow-up wet etching process for removing TSV sacrificial structure 106.

Figure 11:
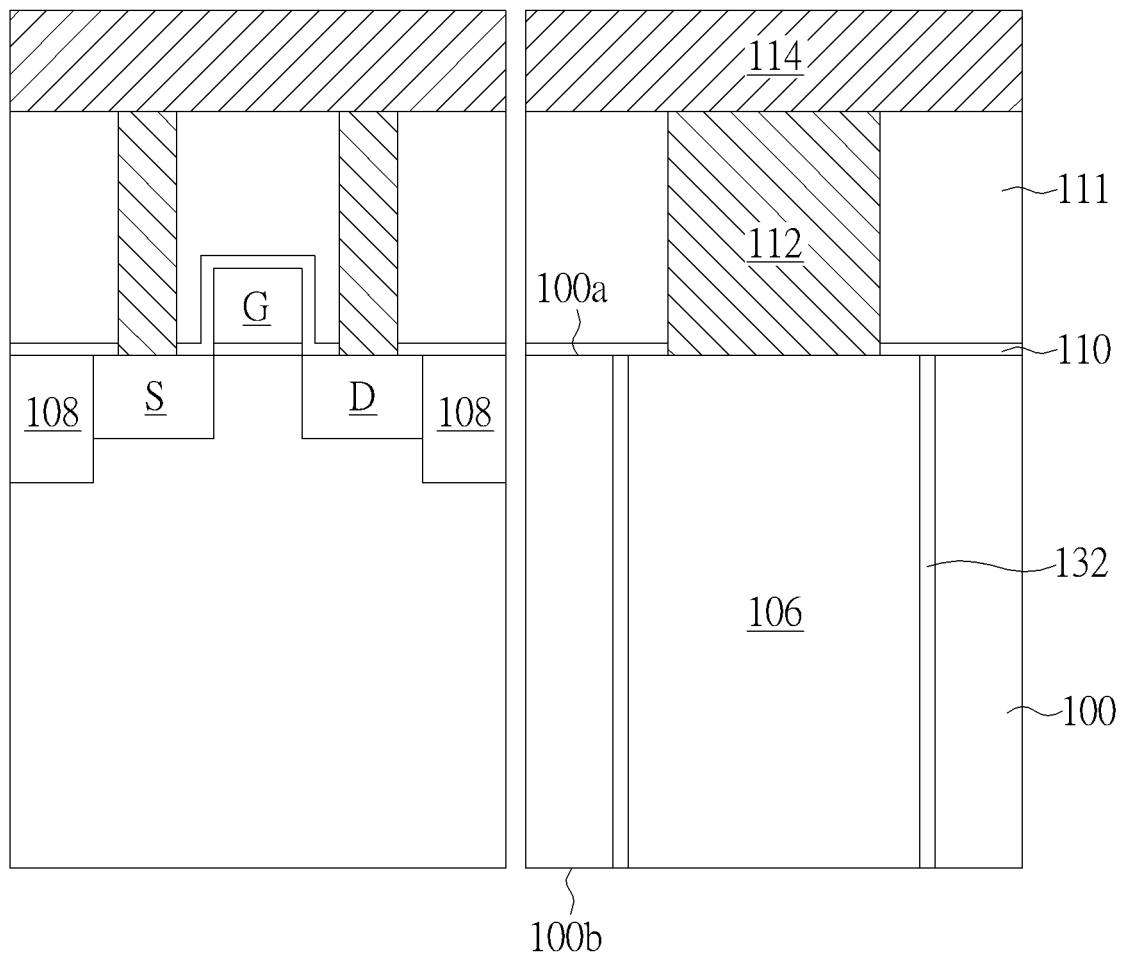

Refer next to FIG. 11. Similar to FIG. 3, a backside thinning process is performed from the back side 100b to remove a part of the substrate 100 in this embodiment so that the inner TSV sacrificial structure 106 is exposed from the back side 100b of the substrate. It can be seen in the figure that, in this step, the protection layer 132 once formed on the bottom surface of the deep trench is also remove so that only the portion of protection layer 132 between the TSV sacrificial structure 106 and surrounding substrate 100 is left.

Figure 12:
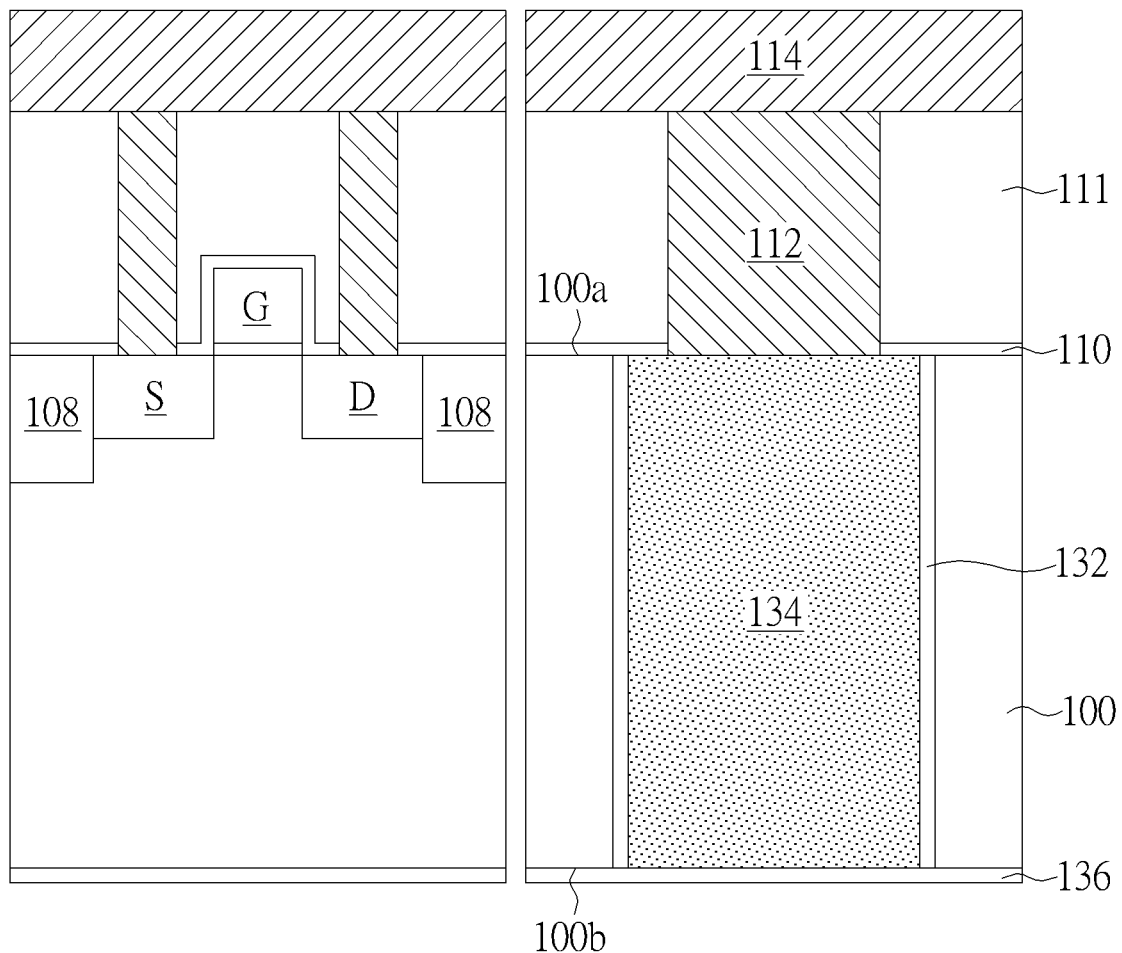

Refer next to FIG. 12. Perform a wet etching process to remove the TSV sacrificial structure 106 in the TSV hole and replace the TSV sacrificial structure 106 by filling in an organic planarization layer (OPL) 134. The material of organic planarization layer 134 may be photoresist with good hole filling property. In this embodiment, since the wet etching process has high etch selectivity only to the material of TSV sacrificial structure 106, thus the process can completely remove the TSV sacrificial structure 106 without damaging the protection layer 132 on the surface of TSV hole, the contact 112 and the etch stop layer 110. In another aspect, it can be seen in the figure that the approach of present invention doesn't need to perform additional etch back process like those did in FIG. 6 to expose the contact 112 from the TSV hole, thereby further preventing the applied plasma damage to the components on the front side during the etch back process. Thereafter, an oxide layer 136 is formed on entire back side 100b of the substrate to cover the substrate 100 and the organic planarization layer 134.

Figure 13:
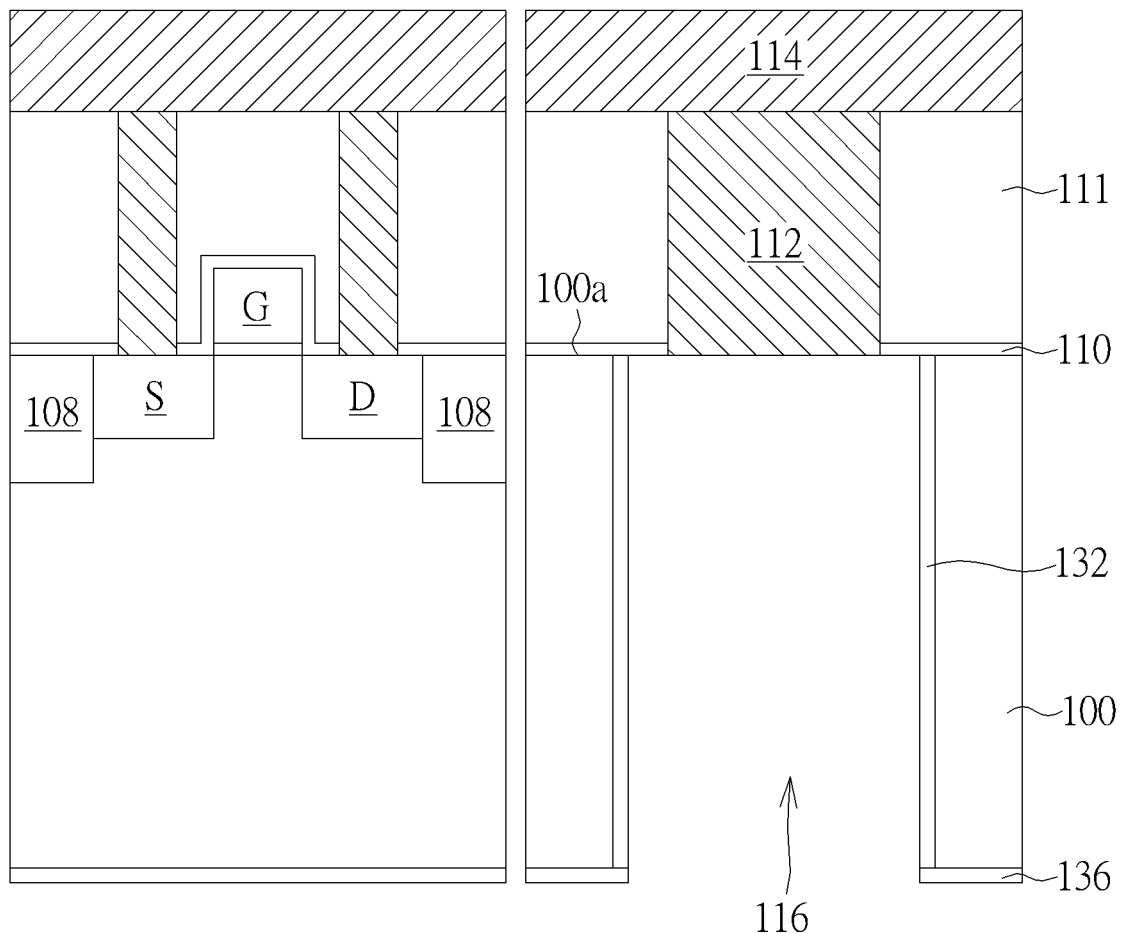

Please refer to FIG. 13. After the oxide layer 136 is formed, a photolithography process is performed to remove the part of oxide layer 136 on the organic planarization layer 134 so that the organic planarization layer 134 may be exposed, and a wet etching process is performed to remove the exposed organic planarization layer 134 to form TSV hole 116. Through the aforementioned process, a protection 132 is provided on the sidewall of the TSV hole 116 while the oxide layer 136 is provided on the back side 100b of the substrate, thus the manufacturing of metal based TSV may begin without the concern of contaminating the substrate surrounded therearound. In conclusion, it is advantageous to this embodiment that no components on the front side of the substrate will be damaged in any steps during the process, although it may have more steps than the one of previous embodiment.

Figure 14:
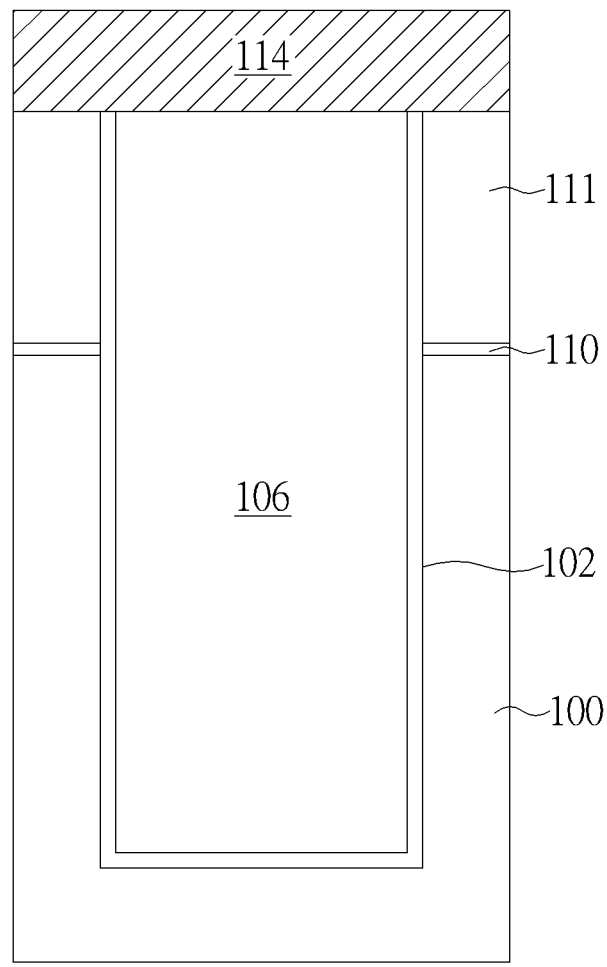
FIG. 14 is a cross-sectional view of a TSV in accordance with still another embodiment of the present invention.
Figure 15:
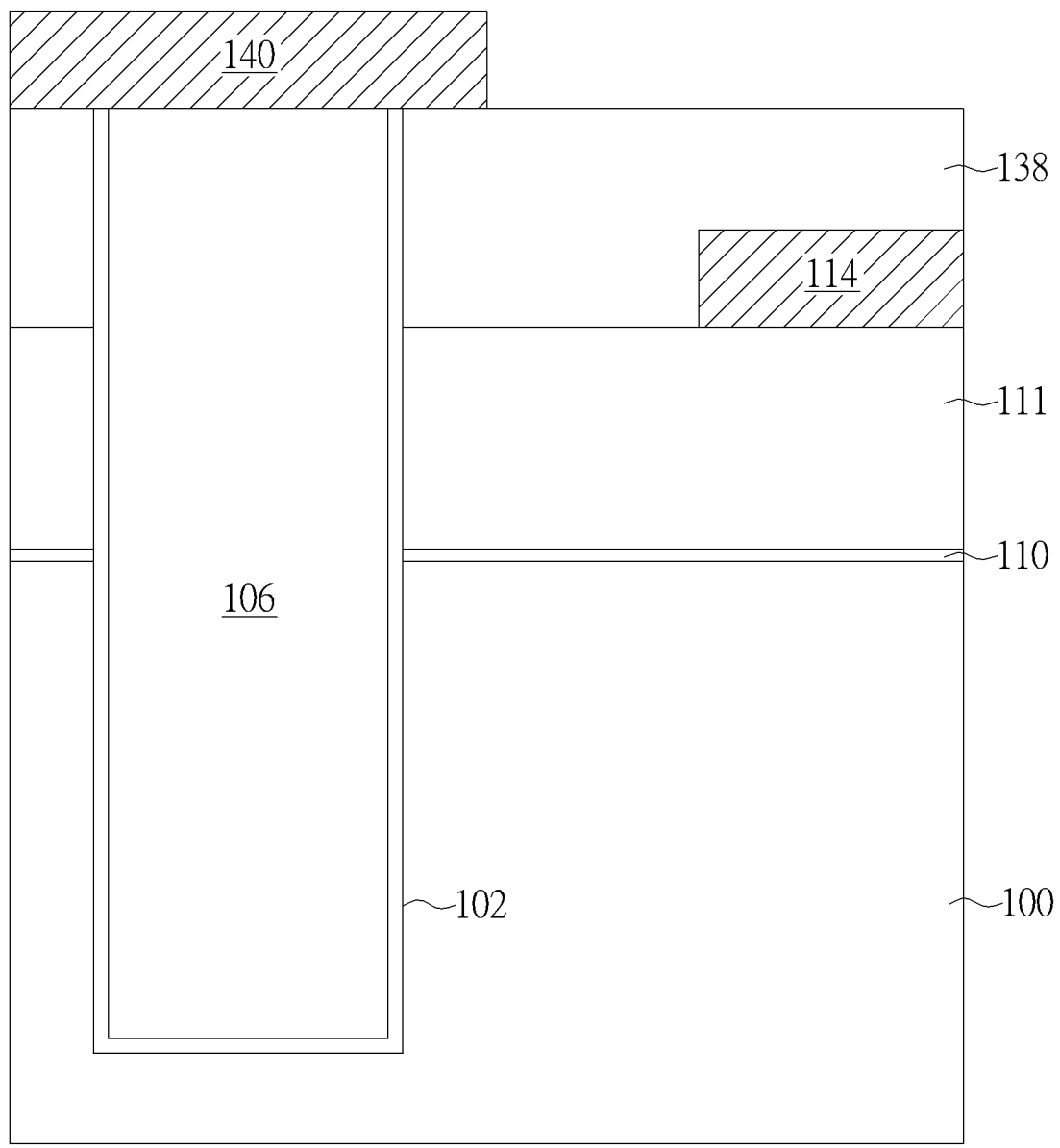
FIG. 15 is a cross-sectional view of a TSV in accordance with still another embodiment of the present invention.

Next, please refer to FIG. 14 and FIG. 15, which are schematic cross-sectional views of a TSV in accordance with still another embodiment of the present invention. In the present invention, instead of beginning from the surface of substrate 100, the manufacturing of the TSV may also be begun from the levels further above on the substrate. For example, in the embodiment of FIG. 14, the deep trench 102 for forming the TSV sacrificial structure 106 is formed extending from the interlayer dielectric layer 111 above the substrate 100 downward into the substrate rather than being begun from the surface of the substrate. The TSV sacrificial structure 106 (and the TSV 124 replacing the TSV sacrificial structure 106 in follow-up process) will be directly connected with the overlying first metal layer 114 without using contact. In the embodiment of FIG. 15, the deep trench 102 is formed extending downwardly from the surface of a first inter-metal dielectric layer (IMD1) 138 above the interlayer dielectric layer 111. The TSV sacrificial structure 106 (and the TSV 124 replacing the TSV sacrificial structure 106 in follow-up process) will be directly connected with the overlying second metal layer 140. In other embodiment, the TSV sacrificial structure 106 may also be formed from the further above levels like IMD2 or IMD3. Alternatively, it may form different kinds of mixed TSVs to connect the metal interconnects in different levels respectively. The approach of this embodiment renders the TSV of present invention more flexibility and variability in the aspect of design.

In summary, the processes of manufacturing through silicon via in aforementioned embodiments solve the problems that may occur during the conventional via first, via middle and via last processes without compromising the merits of these three processes, which is an invention provided with novelty, non-obviousness and industrially applicability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing through silicon via (TSV), comprising:

providing a substrate with a front side and a back side;

forming a TSV sacrificial structure in said substrate, wherein steps of forming said TSV sacrificial structure comprises:
   forming a deep trench on said front side;
   forming a protection layer on a surface of said deep trench, wherein a material of said protection layer is different from a material of said TSV sacrificial structure; and
   filling up said deep trench with dielectric material on said protection layer to form TSV sacrificial structure, wherein said TSV sacrificial structure is exposed from said front side;
forming a metal interconnect on said front side and said TSV sacrificial structure, wherein said metal interconnect contacts with said TSV sacrificial structure;
performing a backside thinning process to expose said TSV sacrificial structure from said back side;
removing said TSV sacrificial structure to form a TSV hole, wherein said backside thinning process removes said protection layer on a bottom surface of said TSV sacrificial structure so that said TSV sacrificial structure is exposed from said back side and said protection layer remains only on a sidewall of said TSV hole;
filling an organic dielectric layer in said TSV hole after said TSV sacrificial structure is removed;
forming an oxide layer on said back side of said substrate and on said organic dielectric layer;
performing a photolithography process to remove said oxide layer on said TSV hole so that said oxide layer remains only on said back side of said substrate;
performing a wet etching process to remove said organic dielectric layer in said TSV hole; and
filling up said TSV hole with conductive material to form a TSV after said organic dielectric layer is removed.

2. The method of manufacturing TSV of claim 1, further comprising forming an etch stop layer on said front side and said TSV sacrificial structure, wherein said etch stop layer contacts with said TSV sacrificial structure, and said metal interconnect passes through said etch stop layer to contact with said TSV sacrificial structure.

3. The method of manufacturing TSV of claim 1, wherein steps of forming said TSV sacrificial structure comprise:
   forming a shallow trench and a deep trench on said front side of said substrate; and
   filling up said shallow trench and said deep trench with dielectric material to forma shallow trench isolation and said TSV sacrificial structure.

4. The method of manufacturing TSV of claim 1, wherein said material of said TSV sacrificial structure is silicon oxide, and said material of said protection layer is silicon nitride or silicon oxynitride.

5. The method of manufacturing TSV of claim 1, wherein steps of removing said TSV sacrificial structure comprise performing a wet etching process to remove said TSV sacrificial structure and expose said protection layer on said sidewall of said TSV hole.

6. The method of manufacturing TSV of claim 1, wherein steps of removing said TSV sacrificial structure comprises performing a wet etching process to remove said TSV sacrificial structure.

7. The method of manufacturing TSV of claim 1, further comprising:
   forming an insulating liner on a surface of said TSV hole and on said back side of said substrate; and
   performing an etch back process to remove said insulating liner on a bottom surface of said TSV hole so that said insulating liner remains only on a sidewall of said TSV hole and on said back side of said substrate.

8. The method of manufacturing TSV of claim 1, further comprising forming a barrier layer on a surface of said TSV hole and on said back side of said substrate, wherein said TSV structure is formed on said barrier layer in said TSV hole.

9. The method of manufacturing TSV of claim 1, wherein said substrate further comprises an interlayer dielectric layer and multiple inter-metal dielectric layers on said interlayer dielectric layer, and said front side is a surface of said interlayer dielectric layer or a surface of one of said inter-metal dielectric layers.

* * * * *